United States Patent [19]
Izawa et al.

[11] Patent Number: 5,182,628
[45] Date of Patent: Jan. 26, 1993

[54] SEMICONDUCTOR DEVICE HAVING PARTICULAR SOLDER INTERCONNECTION ARRANGEMENT

[75] Inventors: Katsuyoshi Izawa, Hitachi; Ryoichi Kobayashi; Masayuki Ozawa, both of Ibaraki, all of Japan

[73] Assignee: Hitachi, Ltd., Tokyo, Japan

[21] Appl. No.: 774,373

[22] Filed: Oct. 10, 1991

Related U.S. Application Data

[63] Continuation of Ser. No. 542,058, Jun. 22, 1990, abandoned.

[30] Foreign Application Priority Data

Jun. 28, 1989 [JP] Japan .................. 1-163990

[51] Int. Cl.⁵ .................. H01L 23/54; H01L 23/34
[52] U.S. Cl. .................. 257/707; 257/779; 257/783
[58] Field of Search ............ 357/81, 75, 74, 67

[56] References Cited

U.S. PATENT DOCUMENTS

| | | | |
|---|---|---|---|
| 4,278,990 | 7/1981 | Fichot | 357/81 |
| 4,470,063 | 9/1984 | Arakawa et al. | 357/81 |
| 4,486,511 | 12/1984 | Chen et al. | 357/67 |
| 4,677,741 | 7/1987 | Takahama | 357/81 |
| 4,796,157 | 1/1989 | Ostrem | 357/81 |

FOREIGN PATENT DOCUMENTS 3009295 10/1980 Fed. Rep. of Germany .
61-139047 6/1986 Japan .

OTHER PUBLICATIONS

"Nondestructive Solder for Thin Metallic Films"—Berry—IBM Technical Disclosure Bulletin—vol. 9, No. 9—Feb. 1967 p. 1071.

Primary Examiner—Rolf Hille
Assistant Examiner—S. V. Clark
Attorney, Agent, or Firm—Antonelli, Terry, Stout & Kraus

[57] ABSTRACT

A semiconductor device which is resistant to cracking during a heat cycle is provided which uses a lead-tin alloy solder having a weight ratio in a range of 45/55 to 55/45 to bond an insulation plate and a heat sink plate of the semiconductor device to one another.

11 Claims, 2 Drawing Sheets

SEMICONDUCTOR DEVICE HAVING PARTICULAR SOLDER INTERCONNECTION ARRANGEMENT

This application is a continuation of application Ser. No. 542,058, filed on Jun. 22, 1990 now abandoned.

BACKGROUND OF THE INVENTION

1. Field of the Invention

The present invention relates to a semiconductor device.

2. Description of the Prior Art

Semiconductor devices are usually bonded to other elements by solder. Such technology is disclosed in JP-A-61-139047, for example.

However, where such a semiconductor device is placed in an engine compartment of an internal combustion engine, it is necessary to solve problems caused by cycling.

For example, in a prior art semiconductor device, a Pb/Sn/Ag alloy solder (weight ratio 93.5/5/1.5) which is a so-called high melting point solder is used. However, in actual practice, there occurs the problem of the solder cracking between an insulation plate and a heat sink plate.

SUMMARY OF THE INVENTION

In order to solve the above problem, the present invention is characterized by that at least the insulation plate and the heat sink plate of the semiconductor device are bonded together by a lead-tin alloy solder having a weight ratio of 45/55 to 55/45.

By using the lead-tin alloy having the weight ratio in a range of 45/55 to 55/45, a semiconductor device is obtained which is very resistant to cracking during the heat cycle.

DESCRIPTION OF THE PREFERRED EMBODIMENTS

An embodiment of the present invention will now explained with reference to the drawings.

Figure 1:
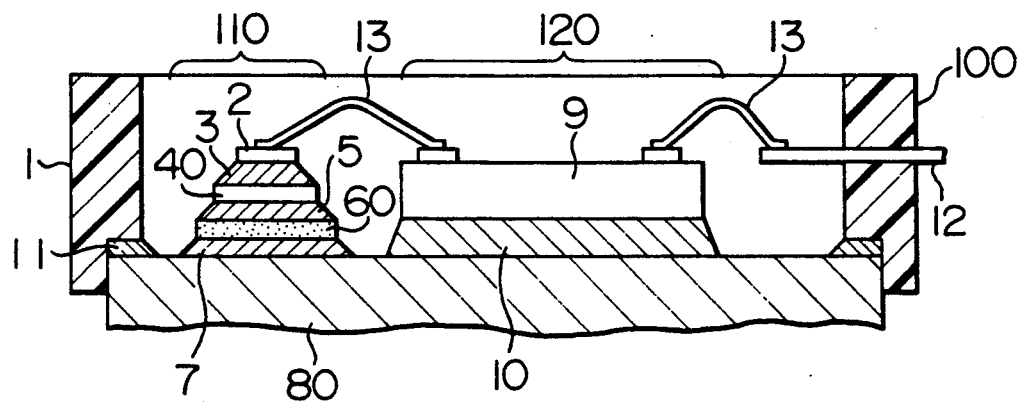
FIG. 1 shows a structure of a semiconductor device of the present invention.

FIG. 1 shows a construction of an ignition device for an internal combustion engine which uses a semiconductor device implementing the present invention. A housing 100 comprises a mold case 1 and a heat sink plate 80 made of copper. The mold case 1 and the heat sink plate 80 are bonded by adhesive material 11.

A power switch semiconductor unit 110 and an amplifying semiconductor unit 120 are accommodated in the housing 100, and they are connected by a lead 13. The amplifying semiconductor unit 120 is further connected to an external terminal 12.

The amplifying semiconductor unit 120 comprises an amplifier circuit board 9 which is fixedly bonded to the heat sink plate 80 by adhesive material 10.

On the ohter hand, the power switch semiconductor unit 110 comprises a semiconductor element 2, a molybdenum plate 40 having a heat sink function, and an alumina plate which is an insulation plate. The semiconductor element 2 and the molybdenum plate 40 are bonded together by Pb/Sn/Ag alloy solder 3 (which can have a weight ratio of 93.5/5/1.5) to provide a high melting point solder), and the molybdenum plate 40 and the alumina plate 60 and the heat sink plate 80 are bonded together by lead-tin alloy solder 7 having a weight ratio of 45/55 to 55/45.

A durability test for a semiconductor device which uses the lead-tin alloy solder having the weight ratio of 45/55 to 55/45 well is now explained.

In the durability test, a tungsten-nickel plated alumina plate of 8.5 mm square and 0.5 mm thick and a semiconductor element (silicon chip) of 8.2 mm square and 0.25 mm thick were placed on a nickel-plated copper plate heat sink of 3.2 mm thick, and they were bonded together by lead-tin solder of 100 $\mu$m thick having different compositions to prepare various test samples. They were left at $-55°$ C. for one hour and at $+150°$ C. for one hour. This cycle was repeated and the number of cycles at which a crack was produced between the alumina plate and the cooper plate was counted.

Figure 2:
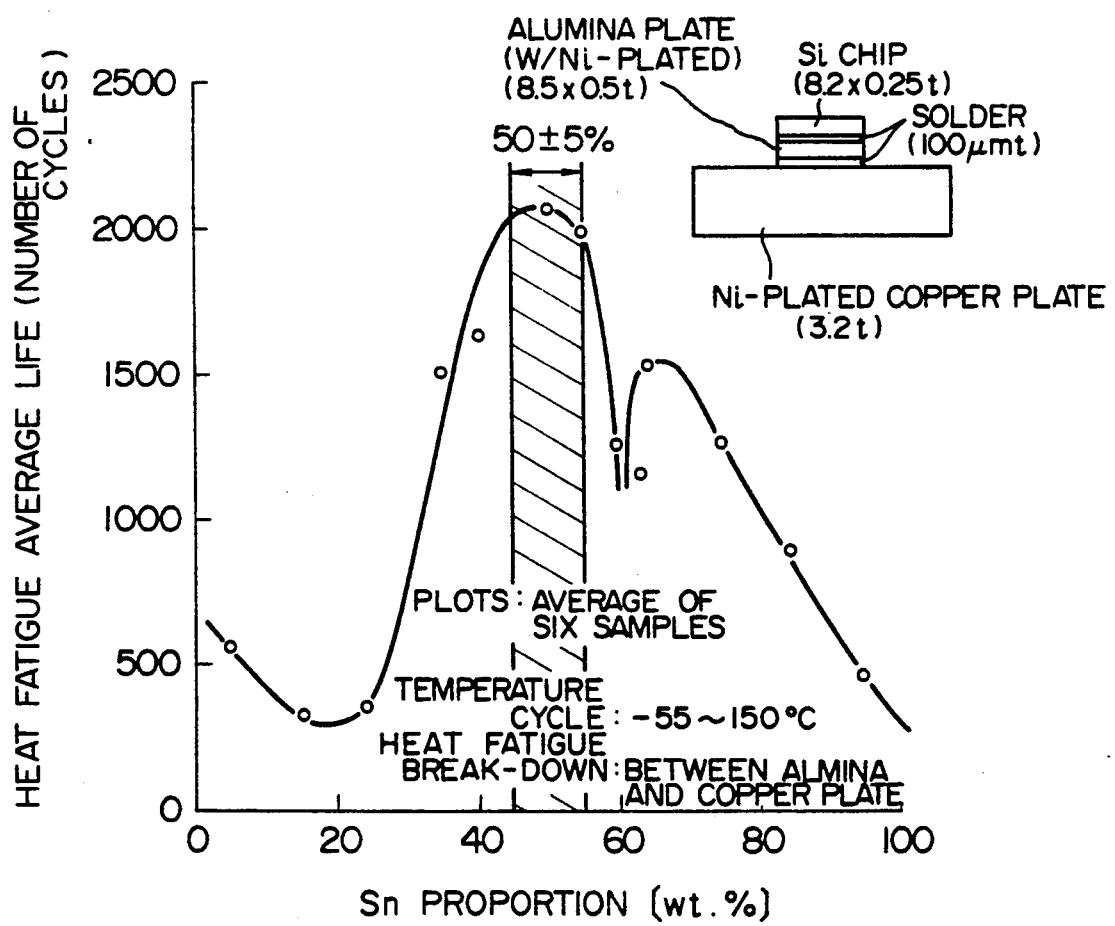
FIG. 2 shows a result of a durability test.

FIG. 2 shows a result of the durability test. An abscissa represents the weight ratio of lead and tin, and an ordinate represent an average life (the number of cycles before a crack is produced).

As seen from FIG. 2, where the lead-tin alloy solder having a weight ratio of 45/55 to 55/45 was used, no crack was detected over 2000 cycles.

In the embodiment of FIG. 1, the heat sink plate 80 and the alumina plate 60 and the molybdenum plate 40 are bonded together by the lead-tin alloy solder 7 having the weight ratio of 45/55 to 55/45. Alternatively, the semiconductor element 2 and the molybdenum plate 40 may also be bonded together by the lead-tin alloy solder having the weight ratio of 45/55 to 55/45.

However, since the lead-tin alloy solder having the weight ratio of 45/55 to 55/45 has a tendency of decreasing the bonding strength over 200° C., it is preferably that it is used for a part which meets a condition of lower than 200° C.

In the semiconductor device of this type, a large contact area is reserved to permit good heat sink property to the insulation plate 60 and the heat sink plate 80 so that the heat of the semiconductor device can escape. Because of the large contact area, cracks are more likely to be produced. Accordingly the lead-tin alloy solder having the weight ratio of 45/55 to 55/45, is used at least between the heat sink plate 80 and the insulation plate 60.

Modifications of the embodiment of the present invention are now explained with reference to FIGS. 3 to 5.

Figure 3:
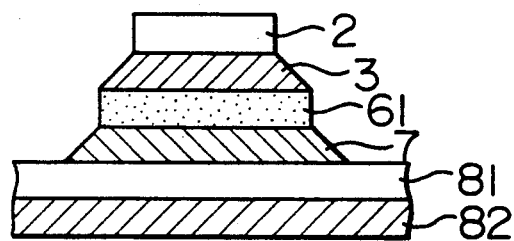
FIGS. 3 to 5 show modifications of the present invention.

In FIG. 3, a semiconductor element 2 and an insulation plate 61 made of beryllium oxide are bonded together by a high melting point solder 3, and a heat sink plate, having a copper plate 81 and an alumina plate 82, is bonded to the beryllium oxide insulation plate 61 by the lead-tin alloy solder having the weight ratio of 45/55 to 55/45.

Figure 4:
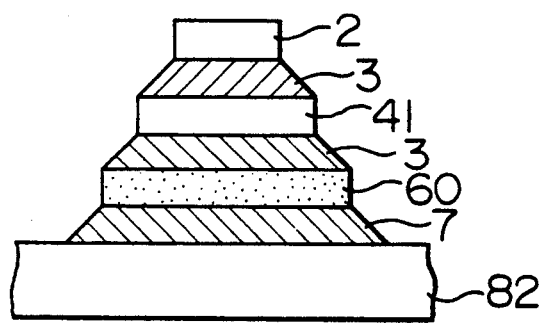

In FIG. 4, a semiconductor element 2, a heat sink plate 41 made of copper and an insulation plate 60 made of alumina are bonded together by high melting point solder 3, and the alumina insulation plate 60 and the alumina heat sink plate 82 are bonded together by the lead-tin alloy solder 7 having the weight ratio of 45/55 to 55/45.

Figure 5:
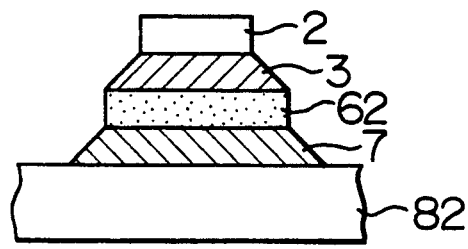

In FIG. 5, a semiconductor element 2 and an insulation plate 62 made of aluminum nitride are bonded together by high melting point solder 3, and the insulation plate 62 made of aluminum nitride and a heat sink plate 82 made of aluminum are bonded together by lead-tin alloy solder 7 having a weight ratio of 45/55 to 55/45.

In the above modifications, the insulation plate and the heat sink plate are bonded together by the lead-tin alloy solder 7 having the weight ratio of 45/55 to 55/45. However, where a working temperature is lower than 200° C., the insulation plate and the semiconductor element may also be bonded together by the lead-tin alloy solder having the weight ratio of 45/55 to 55/45, as described before.

In the embodiment, the power switch semiconductor element has been shown although other semiconductor elements may be used.

In accordance with the present invention, the cracking in the solder between the insulation plate and the heat sink plate during the heat cycle is reduced and a very practical and effective semiconductor device is provided.

What is claimed is:

1. A semiconductor device comprising:
   (a) a semiconductor drive element;
   (b) an insulation plate coupled to said semiconductor drive element through a first solder layer having a predetermined relatively high melting point; and
   (c) a metallic heat sink plate coupled to said insulation plate through a second solder having a lower melting point than said first solder.

2. A semiconductor device comprising:
   (a) a semiconductor drive element;
   (b) an insulation plate coupled to said semiconductor drive element through a first solder layer having a predetermined relatively high melting point; and
   (c) a metallic heat sink plate coupled to said insulation plate through a second solder having a lower melting point than said first solder,
   wherein said second solder has a property of not cracking over substantially 2000 cycles with one cycle comprising being left at −55° C. for one hour and then being left at +150° C. for one hour.

3. A semiconductor device according to claim 1 or 2, wherein said lead-tin alloy solder has a weight ratio in a range of 45/55 to 55/45.

4. A semiconductor device according to claim 1, wherein said insulation plate is bonded to a second heat sink plate located between the insulation plate and said semiconductor drive element by a third solder layer.

5. A semiconductor device according to claim 1, wherein said insulation plate is comprised of a material selected from a group consisting of alumina, beryllium oxide and aluminum nitride.

6. A semiconductor device according to claim 1, wherein said metallic heat sink plate is made of a material selected from a group consisting of copper and aluminum.

7. A semiconductor device according to claim 4, wherein said second heat sink plate located between said insulation plate and said semiconductor drive element is made of a material selected from a group consisting of molybdenum and copper, and wherein said third solder layer has a weight ratio in a range of 45/55 to 55/45.

8. A semiconductor device according to claim 2, wherein said insulation plate is bonded to a second heat sink plate located between the insulation plate and said semiconductor drive element by a lead-tin alloy solder having a weight ratio in a range of 45/55 to 55/45.

9. A semiconductor device according to claim 2, wherein said insulation plate is comprised of a material selected from a group consisting of alumina, beryllium oxide and aluminum nitride.

10. A semiconductor device according to claim 2, wherein said metallic heat sink plate is made of a material selected from a group consisting of copper and aluminum.

11. A semiconductor device according to claim 8, wherein said second heat sink plate located between said insulation plate and said semiconductor drive element is made of a material selected from a group consisting of molybdenum and copper.

* * * * *